(12) United States Patent
Hinch et al.

(10) Patent No.: US 8,512,935 B2
(45) Date of Patent: Aug. 20, 2013

(54) FUNCTIONALIZED PERFLUOROPOLYETHER MATERIAL AS A HYDROPHOBIC COATING

(75) Inventors: Garry Dale Hinch, Salem, OR (US); Sterling Chaffins, Albany, OR (US); Kevin P. DeKam, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/318,741

(22) PCT Filed: May 8, 2009

(86) PCT No.: PCT/US2009/043287
§ 371 (c)(1),
(2), (4) Date: Nov. 3, 2011

(87) PCT Pub. No.: WO2010/128969
PCT Pub. Date: Nov. 11, 2010

(65) Prior Publication Data
US 2012/0064457 A1    Mar. 15, 2012

(51) Int. Cl.
*G03F 7/20* (2006.01)
*G03F 7/004* (2006.01)

(52) U.S. Cl.
USPC .............. 430/280.1; 430/320; 430/273.1; 430/270.1

(58) Field of Classification Search
None
See application file for complete search history.

(56) References Cited

U.S. PATENT DOCUMENTS

| | | | | |
|---|---|---|---|---|
| 3,810,874 A | * | 5/1974 | Mitsch | 528/70 |
| 4,321,404 A | * | 3/1982 | Williams et al. | 560/115 |
| 4,526,833 A | * | 7/1985 | Burguette et al. | 428/336 |
| 5,232,791 A | * | 8/1993 | Kohler et al. | 428/835.2 |
| 5,458,921 A | * | 10/1995 | Briguglio et al. | 427/385.5 |
| 5,731,364 A | * | 3/1998 | Sinta et al. | 522/31 |
| 5,834,564 A | | 11/1998 | Nguyen et al. | |
| 6,015,907 A | * | 1/2000 | Marshall | 546/329 |
| 2002/0197558 A1 | * | 12/2002 | Ferreira et al. | 430/270.1 |
| 2003/0125511 A1 | * | 7/2003 | Choi et al. | 528/401 |
| 2003/0176629 A1 | * | 9/2003 | Blomquist et al. | 528/401 |
| 2005/0265685 A1 | | 12/2005 | Ohashi et al. | |
| 2006/0066672 A1 | | 3/2006 | Park et al. | |
| 2006/0100298 A1 | * | 5/2006 | Ulrich et al. | 522/26 |
| 2006/0216500 A1 | | 9/2006 | Klun et al. | |
| 2007/0254278 A1 | | 11/2007 | DeSimone et al. | |
| 2008/0078990 A1 | * | 4/2008 | Hahn et al. | 257/40 |
| 2008/0107907 A1 | | 5/2008 | Coggio et al. | |

FOREIGN PATENT DOCUMENTS

| | | |
|---|---|---|
| JP | 2005/181986 | 7/2005 |
| KR | 20080016929 | 2/2008 |
| KR | 20080029453 | 4/2008 |
| WO | WO-89-05476 A1 * | 6/1989 |
| WO | WO-2007/021762 A2 * | 2/2007 |
| WO | WO-2007/146531 A1 | 12/2007 |

OTHER PUBLICATIONS

Williams, K.R., et al; Etch Rates for Micromachining Processing; Journal of Microelectromechanical Systems, 5, No. 4, Dec. 1996, pp. 256-269.
Willimas, K.R. et al, "Etch Rates for Micromachining Processing—Part II; Journal of Microelectromechanical Systems," 12, No. 6, Dec. 2003, pp. 761-778.
Turri, S. et al, "End group Chem of Fluoro-Oligomers: Highly Selective Syntheses of Diepoxy, Diallyl, & Tetrad Derivatives," J of Poly Sci: Poly Chem, 34, 1996, pp. 3263-3275.
International Search Report and Written Opinion for PCT/US2009/043287 dated Feb. 1, 2010 (11 pages).
Supplementary European Search Report for EP 09844450 dated Aug. 23, 2012 (12 pages).
Tuteja, A. et al., "Designing Superoleophobic Surfaces," Science, 2007, 318, pp. 1618-1622.

* cited by examiner

*Primary Examiner* — Cynthia Hamilton (57) ABSTRACT

In some embodiments, without limitation, a hydrophobic photoresist material and a method of making the photoresist material are provided. The photoresist material is derived by creating a high resolution insoluble, or more soluble, polymer structure as a result of a controlled chemical reaction with a functionalized perfluoropolyether. Also provided are methods of coating an inkjet printhead surface and processing the coated inkjet printhead surface.

21 Claims, 5 Drawing Sheets

FUNCTIONALIZED PERFLUOROPOLYETHER MATERIAL AS A HYDROPHOBIC COATING

TECHNOLOGICAL FIELD

Without limitation, certain embodiments of the invention generally relate to a hydrophobic photoresist material.

BACKGROUND

Hydrophobic materials are used as coatings, as one example only, on microfluidic surfaces encountered on inkjet printheads. Conditions for the manufacture and subsequent operation of an inkjet printhead require that these hydrophobic materials exhibit chemical resistance during processing (exposure to develop solvents, plasma etching and ashing, chemical wet etching), chemical resistance during usage (ink interactions, environmental stability), and mechanical durability (pen manufacturing, printhead servicing). The combination of hydrophobicity, chemical resistance, and mechanical durability are key requirements for any material being evaluated for such purposes.

Preferably, these hydrophobic materials are patterned, so that certain surface regions remain hydrophobic while others are not. This can be accomplished using typical photoresist methodologies where etching the hydrophobic material can be used to remove areas of the material in question. Alternatively, a photopatternable hydrophobic material can be made in which the material can be selectively placed in certain regions using traditional lithography, while also meeting the chemical and mechanical requirements discussed above.

In one such approach, silane surface treatments have been used to create hydrophobic surfaces. While demonstrating characteristics of a hydrophobic surface, the durability of these materials is inadequate for printhead processing and use. If incorporated into a printhead application, servicing the printhead by wiping would remove the hydrophobic layer leaving the printhead surface wettable once again. Thus, silane and other surface treatment approaches are inadequate based on the mechanical durability requirements.

Siloxane materials have also been used as hydrophobic coatings. However, these materials often cannot withstand traditional printhead fabrication processing including, for example, treating the coating material with an oxygen plasma dry etch and/or a wet etchant. Such materials would be considered inadequate based on the chemical resistance requirements.

Accordingly, a need remains for hydrophobic coatings that are photopatternable, can withstand traditional printhead fabrication processing (including without limitation, wet or dry etching, ashing and baking at a high temperature), demonstrate adequate chemical resistance to inks and other environmental factors during use (including oxidation and temperature stress), and/or show adequate mechanical durability so the surface can be mechanically wiped without loss of intended hydrophobic properties.

SUMMARY

Without limiting the invention to only the embodiments expressly disclosed herein, and without disclaiming any embodiments or subject matter, a formulation for a hydrophobic photoresist material is provided, comprising a functionalized perfluoropolyether. In some embodiments, without limitation, the perfluoropolyether is functionalized with an acid mediated polymerizable functional group, a free-radical polymerizable functional group, an acid labile group, or any combination thereof.

In some embodiments, without limitation, the perfluoropolyether is functionalized with a functionality that reacts with a photoinitiator wherein the reaction changes the solubility of the perfluoropolyether.

A formulation for a hydrophobic photoresist material is provided, comprising a functionalized perfluoropolyether and a photoinitiator.

A formulation for a hydrophobic photoresist material is provided, comprising a functionalized perfluoropolyether, a photoinitiator, and a cosolvent, a compatibilizer, a sensitizer or any combination thereof.

A method of making a hydrophobic photoresist material is provided, comprising the steps of adding a functional group to a perfluoropolyether to functionalize the perfluoropolyether; applying a formulation containing the functionalized perfluoropolyether to at least a portion of a substrate; and exposing the substrate to which the functionalized perfluoropolyether formulation is applied to an energy source. In some embodiments, without limitation, the method comprises a substrate having at least one exposed area and at least one unexposed area, and includes a step of removing at least one exposed area on the substrate with a develop solvent. In some embodiments, without limitation, the method comprises a substrate having at least one exposed area and at least one unexposed area, and includes a step of removing at least one unexposed area on the substrate with a develop solvent.

A method of making a hydrophobic photoresist material is provided, comprising the steps of adding a functional group to a perfluoropolyether to functionalize the perfluoropolyether; mixing the functionalized perfluoropolyether with a photoinitiator to form a functionalized perfluoropolyether formulation; applying the formulation containing the functionalized perfluoropolyether and the photoinitiator to at least a portion of a substrate; and exposing the substrate to which the functionalized perfluoropolyether formulation is applied to an energy source. In some embodiments, without limitation, the method comprises an energy source capable of activating the photoinitiator in the formulation. In some embodiments, without limitation, the method comprises a functional group capable of activation by ionizing radiation and an energy source comprising ionizing radiation.

A method of coating an inkjet printhead surface with a hydrophobic photoresist material is provided, comprising the steps of applying a composition comprising a functionalized perfluoropolyether and a photoinitiator to an area of a printhead; exposing the area of the printhead surface to electromagnetic radiation; thermally crosslinking the functionalized perfluoropolyethers applied to the area of the printhead; and developing unexposed or exposed areas on the printhead.

BRIEF DESCRIPTION OF THE DRAWINGS

Referring now to the drawings, illustrative embodiments are shown in detail. Although the drawings represent some embodiments, the drawings are not necessarily to scale and certain features may be exaggerated, removed, or partially sectioned to better illustrate and explain the present invention. Further, the embodiments set forth herein are exemplary and are not intended to be exhaustive or otherwise limit or restrict the claims to the precise forms and configurations shown in the drawings and disclosed in the following detailed description.

DETAILED DESCRIPTION

Methods and compositions are provided that address at least some of the technological challenges left unaddressed by other formulation or deposition approaches. Without limiting the invention to only the embodiments expressly disclosed herein, and without disclaiming any embodiments or subject matter, a hydrophobic photoresist material is provided which comprises a cross-linked perfluoropolyether film based on a functionalized perfluoropolyether. In some preferred embodiments, the functionalized perfluoropolyether is an epoxy-functionalized perfluoropolyether, although other types of functionalized perfluoropolyether may also be used. The photoresist may be a negative-tone or negative-working resist, where the material to be removed from the lithographic pattern is masked during the exposure process. Alternatively, it may be a positive-tone or positive-working resist, where the material retained in the lithographic pattern is masked during the exposure process.

In some nonlimiting embodiments, a formulation for a hydrophobic photoresist material is provided, comprising a functionalized perfluoropolyether and a photoinitiator. The perfluoropolyether is functionalized with an acid mediated polymerizable functional group, a free-radical polymerizable functional group, an acid labile group, a functionality that reacts with a photoactive catalyst, or any other suitable functionalizing moiety.

In some nonlimiting embodiments, the acid mediated functional group is an epoxy moiety, an oxetane moiety, or any combination thereof; the free-radical polymerizable functional group is an acrylate moiety, a methacrylate moiety, or any combination thereof; and the acid labile group is a tert-butoxycarbonyl moiety.

In some embodiments, without limitation, a formulation is provided wherein a perfluoropolyether is functionalized with a functional group that reacts with a photoinitiator, wherein the reaction changes the solubility of the perfluoropolyether, and the reaction comprises polymerization, crosslinking, deprotection, changes in wetting behavior, any combination thereof, and/or any other reaction resulting in a solubility change. In some nonlimiting embodiments, the functionalizing agent reacts with a photoactive catalyst, changing the solubility of the perfluoropolyether.

In some nonlimiting embodiments, the photoinitiator is comprised of a photoacid generator, including but not limited to, an iodonium salt, a sulfonium salt, or any combination thereof. The photoinitiator may also comprise a free-radical generator. Some nonlimiting examples of suitable free-radical generators include type I (such as derivatives of benzoin ethers, benzyl ketals, a-dialkoxy acetophenones, a-hydroxy alkylphenones, a-amino-alkylphenones, or acylphosphine oxides), type II (such as derivatives of benzophenones/amines or thioxanthones/amines), or visible photoinitiators (such as derivatives of titanocenes). The photoinitiator may also comprise a photoactive reagent.

A method of making a hydrophobic photoresist material is provided, comprising the steps of adding a functional group to a perfluoropolyether to functionalize the perfluoropolyether; mixing the functionalized perfluoropolyether with a photoinitiator to form a perfluoropolyether formulation; applying the perfluoropolyether formulation onto a substrate having at least one exposed or unexposed area; exposing the substrate to which the perfluoropolyether formulation was applied to an energy source capable of activating the photoinitiator in the formulation; and removing at least one unexposed or exposed area on the substrate with a develop solvent. The functionalization step comprises chemical functionalization of the perfluoropolyether with a functional group capable of polymerizing or forming cross-linked products. The functionalization step comprises chemical functionalization of the perfluoropolyether with an acid labile functional group. The functional group comprises an epoxy, vinyl, allyl, oxetane, azirine, bis-azide, acrylate, or methacrylate moiety, or any combination thereof. The functional group comprises a tert-butoxycarbonyl moiety. The mixing step comprises mixing with a photoinitiator in a cosolvent; mixing with a photoinitiator and a compatibilizer; and/or mixing with a photoinitiator and a sensitizer. The energy source comprises electromagnetic radiation.

A formulation for a hydrophobic photoresist material is also provided, comprising a functionalized perfluoropolyether. The perfluoropolyether may be functionalized with a free-radical polymerizable group, such as an acrylate moiety, a methacrylate moiety, or any combination thereof.

A method of making a hydrophobic photoresist material is provided, comprising the steps of adding a functional group to a perfluoropolyether to functionalize the perfluoropolyether, wherein the functional group is capable of activation by ionizing radiation; applying a formulation containing the functionalized perfluoropolyether to a substrate; exposing the substrate to which the perfluoropolyether formulation was applied to an ionizing radiation; and removing at least one unexposed or exposed area on the substrate with a develop solvent. The ionizing radiation comprises an electron beam, a proton beam, or any combination thereof.

A method of coating an inkjet printhead surface with a hydrophobic photoresist material is provided, comprising the steps of applying a composition comprising a functionalized perfluoropolyether and a photoinitiator to an area of a printhead; exposing the area of the printhead surface to electromagnetic radiation; thermally crosslinking the functionalized perfluoropolyethers applied to the area of the printhead; and developing unexposed or exposed areas.

A method of processing an inkjet printhead surface coated at least partially with a cross-linked perfluoropolyether film is provided, comprising the steps, in any order or simultaneously, of thermal treatment, dry etching, and wet etching. The thermal treatment step comprises treating the coated printhead surface with heat and wherein the static contact angle of deionized water is measured to be greater than 90° of the perfluoropolyether surface exposed to a thermal treatment. The dry etching step comprises treating the coated printhead surface with an oxygen plasma ash and wherein the static contact angle of deionized water is measured to be greater than 90° of the perfluoropolyether surface exposed to the oxygen plasma ash. The wet etching step comprises treating the coated printhead surface with a TMAH etchant and wherein the static contact angle of deionized water is measured to be greater than 90° of the perfluoropolyether surface exposed to the TMAH etchant.

A method of making a hydrophobic photoresist material is also provided, comprising the steps of preparing a formulation including an epoxy-functionalized perfluoropolyether and a photoinitiator. Optionally, the formulation may also include organic solvent(s). In particular, a method of making a hydrophobic photoresist material is provided, comprising the steps of epoxidizing an alcohol group on a perfluoropolyether, purifying the epoxidized perfluoropolyether, adding a photoinitiator to the purified epoxidized perfluoropolyether, and activating the photoinitiator, thereby allowing for the polymerization of the epoxidized perfluoropolyether.

A method of coating a printhead surface with a hydrophobic photoresist material is also provided, comprising the steps of applying a composition including an epoxy-functionalized perfluoropolyether and a photoinitiator to an area of a printhead, and exposing the area of the printhead surface to UV light, thereby mediating a ring-opening polymerization of the epoxy-functionalized perfluoropolyether. After UV exposure, heat is used to further crosslink the material, and a develop solvent is used to dissolve away any unexposed regions (example of a negative-tone photoresist). Optionally, the coated printhead surface may additionally be processed by dry and/or wet etching.

As general background that the skilled artisan will appreciate, photoresists typically operate by creating a high resolution insoluble, or more soluble, polymer structure as a result of a controlled chemical reaction. There are two general classes of photoresists that dictate the applicable chemistry and pattern output. For a positive photoresist, a substrate, as one nonlimiting example, a resist film, is exposed with light through a mask causing the exposed regions to be more soluble than unexposed regions. For a negative photoresist, the exposed areas are less soluble than the unexposed regions. The purpose of the photoresist is to resist some of subsequent etch chemistry to protect and then pattern other layers, such as $SiO_2$. Alternatively, the photoresist can be a functional part of a device. In order to achieve either positive or negative tone photopatterning, particular chemistries are required to enable such systems. In positive tone resists, the solubility of exposed areas must increase. Typically, a photoacid is used to create improved solubility as a blend (as one example only, and without limitation, DNQ/Novalak systems) or by chemical reaction (as one example only, and without limitation, chemically amplified systems). As a blend, an acid is created in the presence of the resist which allows wetting and dissolution to readily occur, but no chemical modification of the resist occurs. In a chemically amplified system, an acid causes a chemical reaction which changes the solubility of the resist. In this case, chemical modification of the resist is what causes the change in solubility. For negative photoresists, light mediated polymerization reactions typically occur which decrease the solubility of the exposed regions. In a formulation, a resist with polymerizible functional groups is required as well as a photoinitiator. The photoinitiator can be a free-radical generator, or, more typical of photoresist systems, a photoacid generator. In each case, the photoinitiator reacts with the polymerizible functional groups on the resist to make a crosslinked polymer structure which is now insoluble in develop solvents.

Without limitation and without disclaimer, some embodiments comprise methods and compositions based on the novel use of functionalized perfluoropolyethers as photoresist materials that retain most if not all of their hydrophobic and/or high contact angle characteristics after exposure to etch chemistries and processes, including but not limited to, etch chemistries typical of certain processing steps in inkjet manufacturing.

To synthesize an epoxy-functionalized perfluoropolyether, an alcohol moiety on a perfluoropolyether is epoxidized. Perfluoropolyethers with alcohol moieties are commercially available. As a non-limiting example, perfluoropolyethers may be purchased under the trade name Fluorolink-D, from Solvay-Solexis of Bollate, Italy. Epoxidation of an alcohol group readily occurs by reacting the perfluoropolyether with a suitable base or a suitable epihalohydrin in accordance with methods known to those of ordinary skill in the art. A non-limiting example of a suitable base is potassium tert-butoxide. This and other suitable bases may be purchased from Sigma-Aldrich in St. Louis, Mo., United States. A non-limiting example of a suitable epihalohydrin is an epichlorohydrin or an epibromohydrin. These and other suitable epihalohydrins may be purchased from Sigma-Aldrich in St. Louis, Mo., United States.

The synthesized epoxy-functionalized perfluoropolyether may be purified using a liquid separation, column chromatography, or combinations of both. Both the liquid separation and column chromatography are well known purification methods. Other suitable methods of purification, however, may also be employed. A coating formulation may be prepared by adding a photoinitiator to the epoxy-functionalized, and optionally purified, perfluoropolyether in an organic solvent. In some embodiments, without limitation and without disclaimer, a photoinitiator comprises a compound which absorbs light and undergoes a photoreaction, producing reactive species. These reactive species can initiate or catalyze further chemical reactions in a formulation, causing changes in its solubility and physical properties. There are many different classes of photoinitiators which produce different types of reactive species. As some nonlimiting examples, photoacid generators (or cationic photoinitiators) produce acid on light absorption, which can in turn lead to polymerization of acid-reactive precursors such as epoxies or lead to crosslinking in resins capable of polycondensation reactions. Free-radical photoinitiators use different mechanisms to produce radical-containing species, which can in turn cause polymerization in unsaturated systems such as olefins, styrenes, or acrylates. Other photoactive catalysts include transition metal complexes such as metal alkylidenes, where reactions necessary to produce the catalytically active species can be initiated by light absorption.

Suitable photoacids may include metallic and non-metallic onium salts and non-metallic sulfonic acid precursors which generate strong acids upon exposure to radiation. Typical of the onium salts are diaryliodonium and triarylsulfonium salts. These photoacids may include diphenyliodonium hexafluoroarsenate, di(t-butylphenyl)iodonium hexafluoroarsenate, diphenyliodonium hexafluoroantimonate, di(t-butylphenyl) iodonium hexafluoroantimonate, diphenyliodonium triflate, di(t-butylphenyl)iodonium triflate, triphenylsulfonium hexafluoroantimonate, tri(t-butylphenyl)sulfonium hexafluoroantimonate, triphenylsulfonium hexafluoroarsenate, tri(t-butyl-phenyl)sulfonium hexafluoroasenate, triphenylsulfonium hexafluorophosphate, tri(t-butylphenyl)sulfonium hexafluorophosphate, triphenylsulfonium triflate and tri(t-butylphenyl) sulfonium triflate. It is contemplated that other photoacids may be used.

Sensitizers may also be used in combination with photoinitiators to transfer energy from a wavelength other than what the photoinitiator is capable of absorbing, allowing an expanded range of exposure wavelengths to be successfully used for patterning the photoresist. In some embodiments, without limitation or disclaimer, the photoinitiator absorbs light and after such absorption produces acid that facilitates crosslinking of functionalized perfluoropolyether. In some embodiments, a sensitizer may optionally be added to facilitate absorption of light at desired wavelengths and enhance the acid-mediated crosslinking.

In some embodiments, without limitation, the photoinitiator may be delivered to the coating formulation by a cosolvent or with a compatibilizer. Cosolvents are additional solvents added to the original solvent to provide solubility for all the solid components of the formulation. The use of a cosolvent may also provide improved coating quality by modifying the evaporation rate of the solvents when the formulation is applied to a surface by typical coating methods such as spin coating. Suitable cosolvents known to those of ordinary skill may be used to solubilize the photoinitiator or any other solid component added to the formulation. Similarly, a compatibilizer typically contains different chemical functionalities that allow it to have affinity for different types of materials. When this type of additive is added to a solution containing immiscible components, a properly functionalized compatibilizer will have affinity for both components, allowing them to be solubilized. Typical compatibilizers may include but are not limited to block or graft copolymers and small organic or inorganic molecules.

Depending on the ultimate intended end use of the hydrophobic photoresist material, various additives may also be added to the coating formulation. Non-limiting examples of additives include additional resins, quenchers, plasticizers, stabilizers, colorants, surfactants, thickeners, texturing agents, leveling agents, anti-foaming agents, additional compatibilizers, contact agents and/or antioxidants.

The formulation is measured based on 100% by weight of the total coating solution. The epoxy-functionalized perfluoropolyether may be present in an amount of from about 5% to about 100% or from about 10% to about 50% or from about 15% to about 30% by weight. The photoinitiator may be present in an amount of from about 1% to about 10% or from about 2% to about 8% or from about 3% to about 5% by weight of total solids. The organic solvent may be present in an amount of from about 0% to about 95% or from about 50% to about 90% or from about 70% to about 85% by weight. Other additives, including but not limited to a sensitizer, may be present in an amount of from about 0% to about 10% or from about 2% to about 8% or from about 0% to about 5% by weight. It is contemplated that these percentages may vary to optimize the coating formulation for a particular application.

Without limitation to only those embodiments expressly disclosed herein, and without disclaimer, some embodiments of the invention comprise application to printheads, photoresist applications related to highly chemically resistant (acid, base, solvent, aqueous) and/or wear resistant materials, non-wetting materials, oxygen permeable materials, optically transparent materials, high slip materials, imprint lithography materials, microfluidic applications, and/or low refractive index materials (as some examples only, waveguide structures, optical interconnects, and antireflective coatings).

As one example only, the coating formulation may be applied to at least a portion of a printhead according to a predetermined pattern. Any suitable method of application may be used, as some examples only, dipping the printhead in a bath of the solution, contact-spraying the solution directly on the printhead, or spin-coating the solution onto the printhead.

Once applied to the desired areas of the printhead, the coating formulation may be processed into a hydrophobic photoresist film. Specifically, the photoacid in the coating formulation may be activated by exposure to UV light, which creates free acid ($H^+$) by reaction of the photoacid generator. The acid mediates a ring-opening polymerization of the epoxy-functionalized perfluoropolyether to yield a cross-linked perfluoropolyether film based on the epoxy-functionalized perfluoropolyether.

In some embodiments, without limitation, a hydrophobic photoresist material is provided wherein a functional group is added to a perfluoropolyether to functionalize the perfluoropolyether, and the functional group is capable of activation by ionizing radiation. Aside from more traditional lithographic techniques, ionizing radiation, as some examples only, proton beams or electron beams, can be exposed onto a resist causing chemical reaction. When using proton or electron beams, photoinitiators are generally not needed since the beam itself is the source of the chemical reactant. Additionally, masks are not needed (but may optionally be used) since the beam can directly write onto the resist surface. Thus, lithography using proton or electron beams has been termed "maskless" lithography or "direct write" lithography. From an electron beam, two types of chemical reactions are common. Main chain scission occurs when a polymer depolymerizes along its backbone upon exposure to an electron beam rendering the exposed area more soluble. This type of electron beam-resist system is a positive tone resist. Alternatively, chain linkages may occur due to exposure to an electron beam decreasing the solubility of the exposed areas. This type of electron beam-resist system is a negative tone resist. For a proton beam, cationic polymerizations are the most common and represent a negative tone proton beam-resist system. Thus, in some embodiments, a hydrophobic photoresist material is provided wherein a functional group capable of activation by ionizing radiation is added to a perfluoropolyether to functionalize the perfluoropolyether, and a formulation containing the functionalized perfluoropolyether is applied to a substrate. The substrate to which the functionalized perfluoropolyether formulation is applied is exposed to an ionizing radiation; and at least one unexposed or exposed area on the substrate is removed with a develop solvent. The ionizing radiation comprises an electron beam, a proton beam, or any combination thereof.

In some embodiments, without limitation, a hydrophobic photoresist material is provided, wherein a functional group is added to a perfluoropolyether to functionalize the perfluoropolyether; the functionalized perfluoropolyether is mixed with a photoinitiator to form a perfluoropolyether formulation; the perfluoropolyether formulation is applied to at least a portion of a substrate; and the substrate to which the perfluoropolyether formulation was applied is exposed to an energy source capable of activating the photoinitiator in the formulation. Optionally, the photoinitiator may be omitted when the functional group itself is capable of activation by ionizing radiation. Also, the substrate optionally may receive uniform application of the formulation and be processed in a maskless fashion, or the substrate may have at least one exposed area and at least one unexposed area, and at least one or the other of those areas is removed with a develop solvent.

Figure 1:
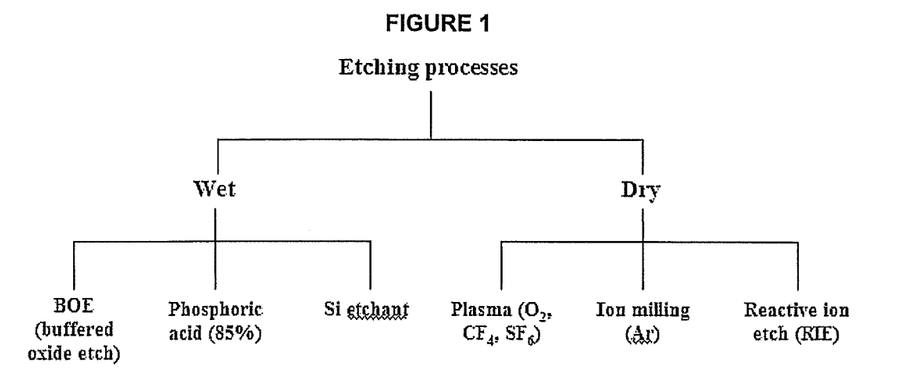
FIG. 1 shows an overview of wet and dry etching techniques used in typical microelectronic fabrication.

With the film in place on the printhead, additional processing can occur. Traditional printhead fabrication processing can include the well-known steps of ashing and etching; an overview of etching techniques is shown in FIG. 1.

For example, dry etching (otherwise known as ashing) is a general term referring to etching methods that use high-energy, ionized gases to remove or clean portions of a fabricated structure. The etchant may be any anisotropic etchant used in, for example, a plasma etching process, an ion milling process, and/or a reactive ion etching (RIE) process. Ionized oxygen and fluorine-containing gases (including $CF_4$ and $SF_6$) are the most common reactive species used in ashing; however, argon is also well known for use in the ion milling process, which involves physical removal of material from surfaces by ionized argon atoms.

The dry etch process requires tailoring of the gas pressure and ion concentration. For example, a typical oxygen plasma dry etch is run at the following conditions: 51 sccm gas flow rate, 50-400 W RF power, 300 mT gas pressure. A typical $CF_4$ dry etch for $SiO_2$ is run at the following conditions: 25 sccm gas flow rate, 100 W RF power, 60 mT gas pressure. A typical Ar ion mill etch is run at the following conditions: Ar ions at 500 V, current density 1 $mA/cm^2$, $2\times10^{-4}$ torr chamber pressure. (Williams et al (1996); Williams et al. (2003)).

Other micromachining methods or dry etches (including laser ablation and photochemical dry etching) may also be used, and optimal conditions for removal of material are dependent on the specific etch tool being used, and the type of material being removed. Any one of these processing methods or a combination thereof may be used for this application.

Wet-etching is a general term for the process that occurs when the substrate is immersed in a chemical (solution) bath. Examples of wet etches include buffered oxide etch (BOE), used for $SiO_2$ etching; phosphoric acid ($H_3PO_4$), used for silicon nitride etching; and wet Si etchant ($HNO_3/H_2O/NH_4F$).

These wet etch processes require tailoring and control of bath chemistry and temperature in order to satisfy etch rate, selectivity, and surface quality requirements. For example, a typical BOE wet etch for $SiO_2$ is run under the following conditions: 5 parts (by weight) 40% aqueous $NH_4F$, 1 part 49% aqueous HF, room temperature. A typical phosphoric acid etch is run under the following conditions: aqueous phosphoric acid (85%), 160° C. A typical wet Si etch is run under the following conditions: 126 parts (by weight) 70% aqueous $HNO_3$, 60 parts $H_2O$, 5 parts 40% aqueous $NH_4F$, room temperature. (Williams et al (1996); Williams et al. (2003)). Other wet etches may also be used, and any one of these or a combination thereof may be used for this application.

These wet and dry etching steps may occur separately or simultaneously and may also be repeated to produce the microfabricated structure. The etching processes may also be used in cleaning a surface, or to modify the wettability of the surface, which can be critical in a microfluidic application. The hydrophobic photoresist material is able to withstand typical processing conditions, especially any treatments with an oxygen plasma ash and a TMAH etchant.

The applied hydrophobic photoresist material provided in this invention is highly durable, abrasion resistant, and can withstand wiping during servicing and processing. Wiping refers to the action of conventional elastomeric wipers used in inkjet printers. Wipers are an integral part of an inkjet printer. When a surface is non-wetting, i.e., hydrophobic, any residual ink on the surface will tend to bead up and be easily removed with a wiper, vacuum, pressurized air, or any other servicing technique. The wiper may be used to remove ink (either dried ink residue, or ink solutions that may mix through puddling, drooling, or wicking on the printhead surface) from the printhead by wiping across the surface. The wiper can also remove any paper dust or debris that has collected on the printhead. It is preferable that a hydrophobic photoresist material is durable and wear-resistant to withstand this wiping action. A typical printhead may receive in excess of 5,000 wipes in its lifetime.

Upon completion of the processing steps, the hydrophobic photoresist material comprising some embodiments retains its hydrophobic properties. The hydrophobic photoresist material also retains a very high contact angle with water (>100°. The contact angle quantifies the surface energies of the system (surface and liquid), and refers to the angle between a drop on a surface and the surface formed by the tangent to the curvature of the drop adjacent to the drop contact with a surface (which is presumed to be flat). If the solid surface is hydrophobic, the contact angle will be larger than 90 degrees. The hydrophobic photoresist material exhibits a contact angle with water that is greater than 90 degrees. In particular, it exhibits a contact angle with water of approximately 110 degrees.

EXAMPLES

The following examples are provided without limiting embodiments of the invention only to those expressly disclosed below, and without disclaiming any embodiments.

A spin coating formulation (A or B) was made including an epoxy-functionalized perfluoropolyether, a photoacid, and an organic solvent. Table 1 below provides the specific weight % for a formulation of some embodiments, without limitation.

TABLE 1

| FORMULATION A | % BY WEIGHT |
|---|---|
| Epoxy-functionalized Fluorolink D (Fluorolink D from Solvay-Solexis) | 12.8% |
| Photoacid - Triarylsulfonium hexafluorophosphate (Aldrich, vacuum distilled from 50% propylene carbonate) | 0.4% |
| Solvent 1 - α,α,α,-Trifluorotoluene (Aldrich) | 34.2% |
| Solvent 2 - 1,4-Bis(trifluoromethyl)benzene (Oakwood or TCI) | 52.6% |

| FORMULATION B | % BY WEIGHT |
|---|---|
| Epoxy-functionalized Fluorolink D (Fluorolink D from Solvay-Solexis) | 14.5% |
| Photoacid - Triarylsulfonium hexafluoroantimonate (Aldrich, vacuum distilled from 50% propylene carbonate) | 0.5% |
| Solvent 1 - 2,2,3,4,4,4-Hexafluoro-1-butanol (Aldrich) | 17.0% |
| Solvent 2 - 1,4-Bis(trifluoromethyl)benzene (Oakwood or TCI) | 68.0% |

As shown in Table 1, the choice of solvent(s) is related to the choice of photoacid, and the combination of chosen solvent(s) with chosen photoacid may affect solubility.

Table 2 provides information on additional hydrophobic photoresist materials for comparative purposes.

TABLE 2

| RESIST | RESIST TYPE |
|---|---|
| SU8 (Microchem, Inc.) | Epoxy Novolak |
| SU8 + fluorinated additive | Epoxy Novolak |

Table 3 provides comparative data of different properties of photoresist materials formed from Formulations A, B and commercial resists (SU8 alone and with fluorinated additive, FO—POSS=1H, 1H, 2H, 2H-tridecafluorooctyl polyhedral oligomeric silsesquioxane (Tuteja et al. (2007)). Each of the photoresist materials was applied to SU8 coated silicon, and tested for contact angle. Specifically, the hydrophobic properties on the coupon after ashing and etching were measured.

TABLE 3

| | CONTACT ANGLE (DI water, static) | | |
|---|---|---|---|
| FORMULATION | Pre-Ash/Etch | Post-Ash | Post TMAH Etch |
| A or B | 110° | 110° | 110° |
| SU8 (Microchem, Inc) | 75° | <10° | 75° |

TABLE 3-continued

| | CONTACT ANGLE (DI water, static) | | |
|---|---|---|---|
| FORMULATION | Pre-Ash/Etch | Post-Ash | Post TMAH Etch |
| SU8 + FO-POSS | 108° | — | 56° (post-ash/etch) |

The hydrophobic photoresist material of Formulation A or B was able to withstand the printhead fabrication processing. Specifically, the photoresist material retained its hydrophobic properties after plasma ash and wet etch, as measured by the high contact angles. It also showed improved resistance over other formulations to the processing steps of dry and wet etching.

Synthesis of Fluorolink-D Epoxy

Synthesis of Fluorolink-D epoxy may be carried out with minor modifications from the method of Turri, et. al. ("End Group Chemistry of Fluoro-Oligomers: Highly Selective Syntheses of Diepoxy, Diallyl, and Tetraol Derivatives", Turri, S., Scicchitano, M., and Tonelli, C. *J. Polym. Sci.*, 34 (1996), pp. 3263-3275).

A typical synthesis procedure was carried out as follows: a solution of Fluorolink D (400 g), 1.0 M potassium tert-butoxide in tert-butanol (440 mL), and tert-butanol (400 mL) was stirred at 40° C. for 1 h under nitrogen. This solution was slowly added over the course of an hour to a stirring solution of epichlorohydrin (314 mL, 10 eq) and tert-butanol (200 mL) at 80° C. under nitrogen. Following the addition, the reaction was allowed to proceed for 2-24 h under nitrogen. During this time, a salt precipitate was formed. Once the reaction was complete, the mixture was allowed to cool and filtered by decanting the solution onto a medium flow rate filter paper to remove residual salt. The mother liquor was then diluted with Freon 113 (~50% volume) and washed several times with water. The organic phase can then be passed through an alumina plug (activated, neutral, Brockmann 1, ~150 mesh) using Freon 113 as the mobile phase. After reduction of the excess solvent by rotary evaporation, the product was filtered through a 0.45 µm polyethersulfone filtration disk to yield a slightly yellow oil (yields routinely range from 40-50%).

As indicated previously, some embodiments comprise methods and compositions wherein functionalized perfluoropolyethers useful as photoresist materials retain most if not all of their hydrophobic and/or high contact angle characteristics after exposure to certain etch chemistries and processes, whether in a negative tone resist, a positive tone resist, or otherwise. As a nonlimiting example, the synthesis of Fluorolink D epoxy illustrates the functionalization of perfluoropolyethers which may be used as a component in a negative tone resist. In general, this process is not isolated to Fluorolink D and is not isolated to negative tone resists. Other examples of perfluoropolyethers that can be epoxidized include, but are not limited to, Fluorolink D-10H, Fluorolink D10, Fluorolink E, Fluorolink E10, Fluorolink T, Fluorolink T10, Fomblin Z Dol 2000, Fomblin Z Dol 2500, Fomblin Z Dol 4000, Fomblin Z Dol TX, Fomblin Z Tetraol, or other perfluoropolyethers with an alcohol or other common functionality typically used as a precursor in epoxidation reactions. Additionally, a positive tone resist could be created by functionalizing a perfluoropolyether with a tert-butyloxycarbonyl (t-Boc) moiety. Other functionalities that enable polymerization, typical of a negative tone resist, or a solubility change without polymerization, typical of a positive tone resist, could also be employed. Examples of other negative tone resist functionalities include, but are not limited to, bisazides, acrylates, methacrylates, vinyls, allyls, oxetanes, and azirines which can also be used. Whether in the particular etch process the photoacid is being used to modify solubility or is being used to create polymerization, some embodiments provide functionalized perfluoropolyethers that comprise novel photoresist materials which retain their hydrophobic nature and result in high contact angle regardless of the specific etch process.

Photoresist Formulation with Fluorolink-D Epoxy

A photoresist is a light-sensitive formulation that undergoes chemical changes upon exposure to light and subsequent thermal curing. Typically, a photoacid is used as a component in which exposure to light activates the release of acid within the resist formulation. The acid can then proceed to mediate chemical reactions such as deprotection, as is common in positive tone resists, or polymerization, as is common in negative tone resists. This may allow the material to be photopatterned, where the difference in solubility of the exposed and unexposed regions leads to the creation of a photopatterned resist. Regions that are more soluble can be removed with appropriate solvents (developers), while the less soluble features remain on the coated surface.

Photoresists often contain some or all of the following components: a base pre-polymer, a photoinitiator/catalyst, solvents, sensitizers, and other additives. The base pre-polymer combined with the photoinitiator/catalyst (for example, photoacid generators for epoxy-based pre-polymers, or free-radical generators for acrylate-based pre-polymers) provide the light induced patterning capability described above. Solvents are generally necessary for component solubility, and to provide the appropriate viscosity for coating a thin layer of the formulation onto a substrate, using methods common in electronic device fabrication (spin/blade/spray coating). The evaporation rate of the solvent(s) is critical in providing acceptable film quality (uniform coating thickness and film homogeneity) for the resist layer. Sensitizers may be used in conjunction with photoinitiators to transfer energy from wavelengths other than what the photoinitiator is capable of absorbing, allowing for broader photosensitivity. Examples of other additives include hardeners to provide increased crosslink density, dyes to control light by absorbing specific wavelengths, or surfactants to provide improved film uniformity and reduce/eliminate pinhole and bubble defects in the film.

One challenge in creating a hydrophobic photoresist involves the solubility of the base prepolymer and the photoacid generator. As one nonlimiting example of a base prepolymer, Fluorolink D epoxy is a highly fluorinated material. On the other hand, a typical photoacid generator is an organic salt that is not usually miscible in heavily fluorinated environments. In a direct approach, the choice of solvent alone may be sufficient to produce sufficient solubility in view of the particular base polymer and photoacid, as one example only, in view of the selection and use of a photoacid generator with an adequate amount of fluorination to provide direct component miscibility. In other cases, an indirect approach using "compatibilizers" may be appropriate. Examples of compatibilizers for possible use in an indirect approach include, but are not limited to, fluorosurfactants such as Zonyl™ surfactants produced by DuPont. In this case, we describe solvents as compatibilizers although other compatibilizers such as surfactants could also be used.

In general, combining two immiscible components can be accomplished by using a combination of solvents which are individually miscible with these components, miscible with each other, and can then be combined to create a fully miscible formulation. For Fluorolink D epoxy, highly fluorinated solvents such as, but not limited to, 4-(trifluoromethoxy) toluene, 1,3,5-tris(trifluoromethyl)benzene, 2,5-bis(trifluoromethyl)bromobenzene, 1,4-bis(trifluoromethyl)benzene, H-Galden ZV60, and H-Galden ZT130 provide adequate solubility. For onium type PAGs such as triarylsulfonium hexafluorophosphate or triarylsulfonium hexafluoroantimonate, solvents such as, but not limited to, trifluorotoluene (TFT), 3-methylbenzotrifluoride, 2-fluorobenzotrifluoride, 4-methylbenzotrifluoride, 2-chlorobenzotrifluoride, α,α,α-trifluoro-m-tolunitrile, and 3-(trifluoromethyl)acetophenone provide adequate solubility with concomitant miscibility to the solvents listed above with Fluorolink D epoxy solubility. Other PAGs including, but not limited to, iodonium and sulfonium salts, with corresponding counteranions including, but not limited to, triflate, nitrate, hexafluorophosphate, hexafluoroantimonate, perfluoro-1-butanesulfonate, and p-toluenesulfonate can be used. In addition, non-ionic photoacid generators such as 2-(4-methoxystyryl)-4,6-bis(trichloromethyl)-1,3,5-triazine, Irgacure PAG 121 (Ciba), and Irgacure PAG 203 (Ciba) can also be used.

In the case where the photoacid itself does not absorb enough light at the exposure wavelength, sensitizers can be used to transfer light energy to the photoacid. This can enable the use of a broader array of photoacids since direct light absorption of the photoacid is not required. Examples of sensitizers include, but are not limited to, 7-diethylamino-3-thienoylcoumarin, 9,10-dimethoxy-2-ethyl anthracene, 9,10-diethoxyanthracene, and 9-anthracenecarboxylic acid. Other sensitizers can also be used and are often chosen based on their absorptivity at a particular wavelength, their ability to transfer energy to a photoacid generator, and their solubility.

To modify the mechanical properties of the formulation, hardening additives can be used. For epoxies, hardeners include polyamines and anhydrides which form physical crosslinks with the epoxy prepolymer. Hardeners can also be high glass transition ($T_g$>room temperature) additives that do not form physical crosslinks with the prepolymer material, but improve the mechanical properties of the bulk film.

Other additives such as dyes, for light control, and surfactants, for processing, rheology, and dispersion control, can also be used. Dyes would be chosen based on their solubility and absorptivity at a particular wavelength. Surfactants would be chosen for their ability to solubilize immiscible components, improve processing such as spin coating, and improve coating defects such as bubbles and/or pinholes.

Optimization of Photoresist Formulation and Process Conditions for Formulation A As those of ordinary skill will appreciate, for any photoresist formulation, there is a set of component concentrations and process conditions that will produce optimal lithographic performance. We conducted tests to screen several different formulation and process variables.

The basic test formulation was comprised of Fluorolink-D epoxy dissolved in a mixture of BTFB and TFT (13.2% solids). The substrate for coating was a 1 inch×1 inch Si coupon with a cured SU-8 underlayer. A layer containing the Fluorolink-D epoxy formulation was fabricated by spin-coating using the following process conditions: 100 rpm/3 sec. dispense, 10 sec. ramp to 1000 rpm/60 sec. coating spin. After coating the wet film, the substrate was softbaked at 90° C. for 10 minutes. Exposure through a transparency mask (printed at 5080 dpi by PageWorks, Cambridge, Mass.) was done on an OAI Hybralign Series 200 aligner (exposure energy=10 mJ/cm$^2$/sec, measured at 365 nm). After exposure, a post-expose bake was done, after which the wafer was allowed to cool for 10 minutes. The unexposed areas of the Fluorolink-D film were then spin developed off with solvent (30 sec. spray, BTFB) followed by an ethyl lactate rinse (30 sec./1000 rpm spray, followed by 60 sec./2000 rpm drying spin). Final crosslinking of the film was accomplished with a 170° C./30 min. hardbake.

The variables tested are listed in Table 4. The seven variables screened in this test included % photoacid (by weight of total solids), formulation solvent ratio (BTFB:TFT), softbake/no softbake, photoexpose time, post-expose bake time, post-expose bake temperature, and develop solvent used (either pure BTFB or a BTFB/TFT mixture).

TABLE 4

Protocol to optimize formulation/process conditions

| % photoacid (of solids) | PEB temperature (°C.) | BTFB:TFT ratio (w:w) | PEB time (min) | Expose time (min) | Develop solvent | Softbake | Lithographic quality |
|---|---|---|---|---|---|---|---|
| 1.5 | 90 | 60:40 | 10 | 2 | BTFB | N | Good |
| 3 | 120 | 60:40 | 2 | 5 | BTFB | Y | Good |
| 3 | 120 | 60:40 | 10 | 2 | BTFB | N | Good |
| 3 | 120 | 80:20 | 10 | 5 | BTFB | Y | Good |
| 1.5 | 120 | 80:20 | 2 | 5 | BTFB | N | Poor |
| 1.5 | 120 | 60:40 | 2 | 2 | BTFB | Y | Poor |
| 1.5 | 120 | 60:40 | 10 | 5 | BTFB/TFT | N | Poor |
| 3 | 90 | 60:40 | 2 | 2 | BTFB | Y | Poor |

Good lithographic quality
Poor lithographic quality

Figure 2:
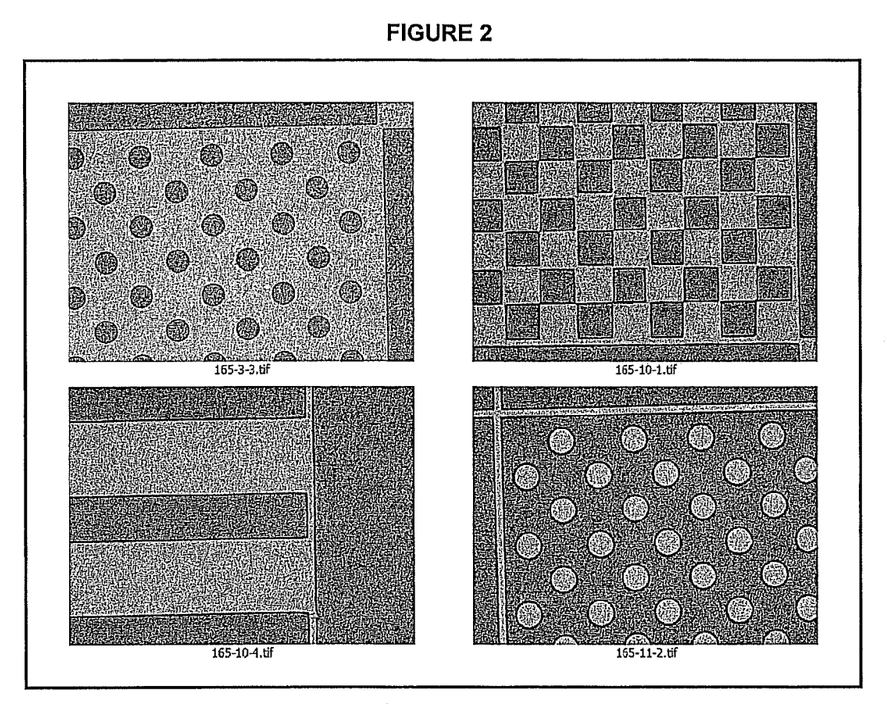
FIG. 2 shows micrographs from trials producing high-quality lithographic patterns.
Figure 3:
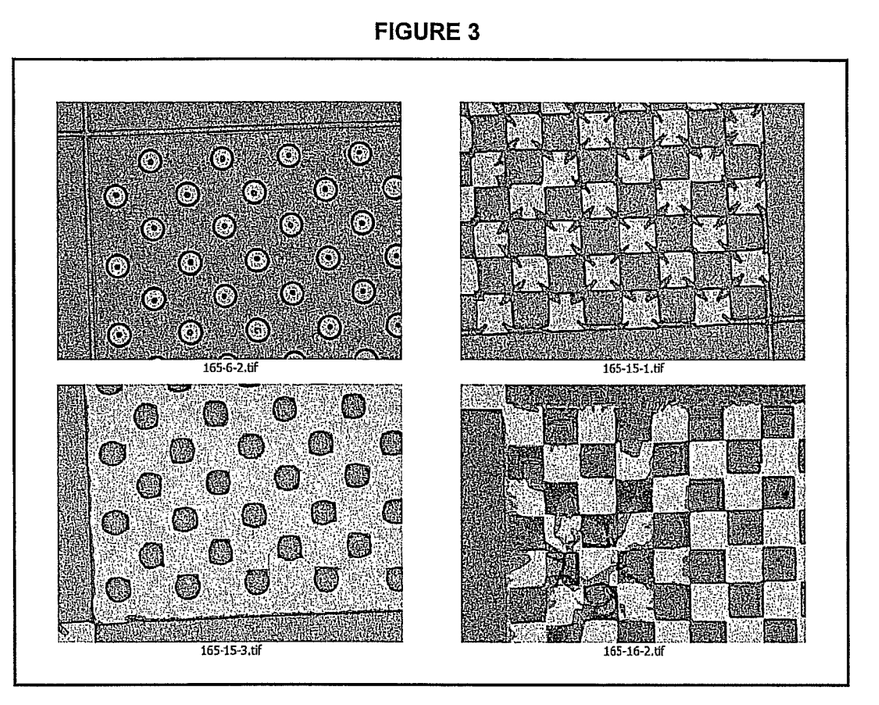
FIG. 3 shows micrographs from trials producing low-quality lithographic patterns.

Table 4 also contains an assessment of lithographic image quality from the design. Photomicrographs were taken of the photopatterns produced in each trial (Zeiss Axiotron2 microscope equipped with a Sony DXC-5500 digital camera/capture system) and qualitative image quality rankings were assigned based on overall reproducibility of the pattern, edge sharpness, complete resist removal from unexposed areas, and resistance to washout (removal of resist from exposed areas).

A statistical analysis of the results indicates that the more important parameters controlling the lithographic quality are the % photoacid and the PEB temperature. These variables interact with each other, so specific combinations of the variables result in high quality lithographic performance, while the opposite combinations produce poor performance. This is illustrated in the results from Table 4, where all the trials with the best lithographic performance combined low photoacid concentration with low PEB temperature (1.5% PA, 90° C. PEB) or high photoacid concentration and high PEB temperature (3.0% PA, 120° C. PEB). Conversely, all trials with the worst performance had the opposite combination of these variables (1.5% PA, 120° C. PEB; 3.0% PA, 90° C. PEB).

The photomicrographs of FIG. 2 and FIG. 3 illustrate the features used to determine the overall image quality rankings. The micrographs from FIG. 2 show high-quality lithographic patterns illustrated by good feature definition and complete resist removal from unexposed (lighter-colored) areas. The micrographs from FIG. 3 show low-quality lithographic patterns illustrated by incomplete resist removal from unexposed areas (spots in light-colored circles) and feature washout (illustrated in the checkerboard pattern at the lower right of FIG. 3).

Formulation and Coating Process for Wafer-Scale Lithography

The functionalized perfluoropolyether formulations can also produce hydrophobic materials that are capable of being photopatterned on a wafer scale. In comparison to Formulation A, Formulation B (Table 1) utilizes 2,2,3,4,4,4-hexafluoro-1-butanol (HFB) rather than TFT and also uses the hexafluoroantimonate PAG instead of the hexafluorophosphate PAG. Changes in the solvents used in the formulation can affect solubility of the other components, for example, allowing increased photoacid loading. Also, the solvent used can affect viscosity and/or evaporation rate of the formulation, which can affect coating quality, and the ultimate quality of the lithographic pattern produced after development of the exposed photoresist.

Formulation B has an 80:20 ratio (w:w) of BTFB:HFB, and 15.0% solids. The coating substrate used was an eight inch Si wafer with an SU-8 underlayer. A layer containing the Fluorolink-D epoxy formulation was spin-coated using the following process: 100 rpm/3 sec. dispense, 10 sec. ramp to 1000 rpm/60 sec. coating spin. After coating the wet film, the substrate was softbaked for at 90° C. for 10 minutes. Exposure through a glass photomask was done on an OAI Hybralign Series 200 aligner (total exposure=600 mW/cm$^2$, measured at 365 nm). After exposure, a post-expose bake was done (90° C./2 min.) and the wafer was allowed to cool for 10 minutes. The unexposed areas of the Fluorolink-D film were then developed off with BTFB (30 sec./1000 rpm spray, followed by 60 sec./2000 rpm drying spin) followed by rinsing with ethyl lactate (30 sec./1000 rpm/30 sec./1500 rpm spray, followed by 45 sec./3000 rpm drying spin). Final crosslinking of the film was accomplished with a 170° C./30 min. hardbake.

Figure 4:
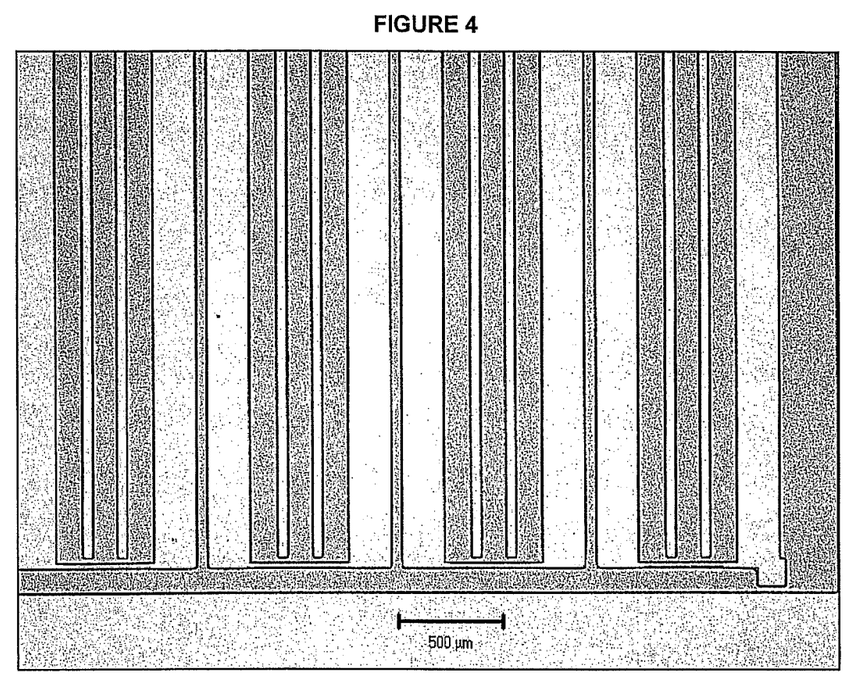
FIG. 4 shows photopatternability using a Fluorolink-D epoxy formulation (2.5× magnification).
Figure 5:
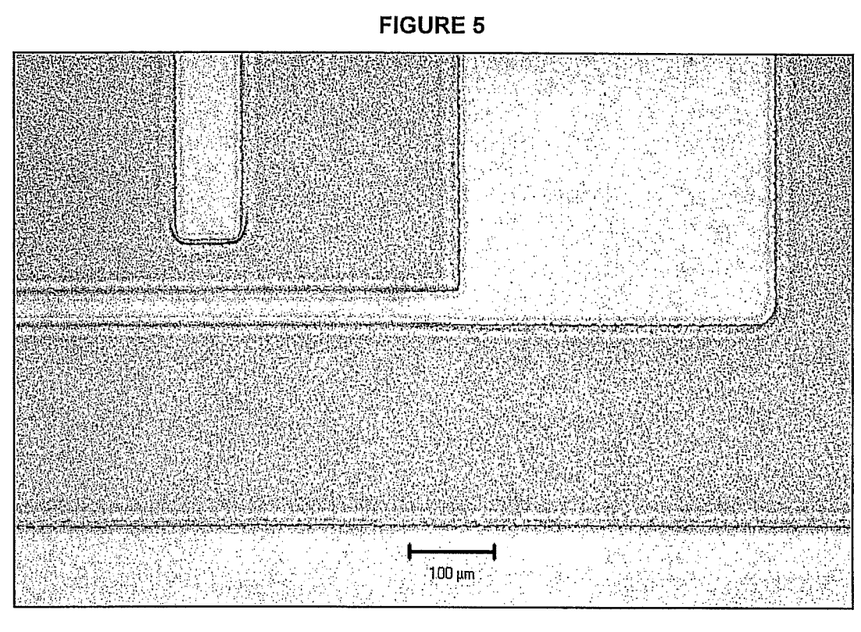
FIG. 5 shows photopatternability using a Fluorolink-D epoxy formulation (10× magnification).

FIG. 4 and FIG. 5 both illustrate the film quality and the feature resolution produced by the coating and photopatterning process on a wafer scale. The patterns produced in the photoresist are highly uniform, and pattern resolution (ca. 30 µm) is sufficient for microfluidic applications.

Demonstration of low surface energy for Fluorolink-D epoxy coatings

Crosslinked films of the Fluorolink-D epoxy used as the base ingredient of the photoresist formulation contain high fluorine content. To evaluate the surface energy of the material, wafers were coated with a Fluorolink-D epoxy formulation, and contact angles measured at various steps of the coating/exposure/curing process.

This formulation was prepared with an 80:20 ratio (w:w) of BTFB:HFB, and 25% solids. As compared with formulation B, which uses the same components but at a 15% solids loading, this modification increased the total solids concentration to make a thicker film upon spin coating. This formulation is used to evaluate the chemical resistance of the film during processing. After each critical processing step, contact angles are measured to evaluate the surface energy properties of the film. The following discussion will detail the processing conditions.

The coating substrate was an eight inch Si wafer with an SU-8 underlayer. A layer containing the Fluorolink-D epoxy formulation was spin-coated using the following process: 100 rpm/3 sec. dispense, 10 sec. ramp to 1000 rpm/60 sec. coating spin. After coating the wet film, the substrate was softbaked at 90° C. for 10 minutes. Blanket exposure (entire wafer surface exposed) was done on an OAI Hybralign Series 200 aligner (total exposure=1200 mW/cm$^2$, measured at 365 nm). After exposure, a post-expose bake was done (90° C./3 min.) and the wafer allowed to cool for 10 minutes. For the wafers processed past the PEB step, the unexposed areas of the Fluorolink-D film were then developed off with BTFB (30 sec./1000 rpm spray, followed by 60 sec./2000 rpm drying spin). For samples proceeding beyond BTFB development, the surface was then rinsed with ethyl lactate (30 sec./1000 rpm/30 sec./1500 rpm spray, followed by 45 sec./3000 rpm drying spin). For samples proceeding beyond ethyl lactate rinse, final crosslinking of the film was done with a 170° C./30 min. hardbake.

After baking, wafers were treated with an oxygen plasma, or ash. Using a Matrix Bobcat 209 Asher, the following ash conditions were used: chuck temperature=65° C.; pressure=1250 mTorr; microwave power=2 kW; RF power=200 W; time=90 sec.; oxygen gas flow=810 sccm; nitrogen gas flow=90 sccm. After ash, the wafers were treated with a silicon wet etch process on an Akrion Wet Bench. The following cycle was repeated six times: TMAH (5,5) etch, 80° C., 20 min.; DI water rinse, room temperature, 5 min.; SC1 etch, (1:1:10, $NH_4OH:H_2O_2:H_2O$), room temperature, 3 min.; DI water rinse, room temperature, 5 min.

Contact angle measurements were made with an FTA125 contact angle/surface tension instrument (First Ten Angstroms, Inc., Portsmouth, Va.) using distilled water. The contact angle results are summarized in Table 5 (six individual measurements averaged to produce each contact angle and standard deviation). For comparison, SU-8 processed through TMAH etch is also listed.

TABLE 5

Contact angle data for Fluorolink-D epoxy coatings

| Wafer # | Process | Contact angle (degrees, x = 6) | Std. dev. |
| --- | --- | --- | --- |
| 1 | SB, expose, PEB | 107.1 | 1.6 |
| 2 | SB, expose, PEB, BTFB | 109.5 | 0.6 |
| 3 | SB, expose, PEB, BTFB, EL (bath) | 109.0 | 1.7 |
| 4 | SB, expose, PEB, BTFB, EL (bath), HB | 100.2 | 5.4 |
| 5 | SB, expose, PEB, BTFB, EL (bath), HB, Ash | 109.8 | 1.9 |

TABLE 5-continued

Contact angle data for Fluorolink-D epoxy coatings

| Wafer # | Process | Contact angle (degrees, x = 6) | Std. dev. |
|---|---|---|---|
| 6 | SB, expose, PEB, BTFB, EL (bath), HB, Ash, TMAH | 109.9 | 3.2 |
| 7 | Crosslinked SU-8 | 74.4 | 0.0 |

SB = softbake,
PEB = post-expose bake,
BTFB = BTFB develop,
EL = ethyl lactate rinse,
HB = hardbake,
ash = O2 plasma ash,
TMAH = TMAH wet etch The Fluorolink-D epoxy coating showed contact angles of >100° at each step of the coating process after initial crosslinking from the post-expose bake step. These high contact angles show the non-wetting nature of these coatings, particularly when compared to a typical photoresist material such as SU-8. The results from wafers 5 and 6 demonstrate the chemical resistance of the coatings, as high contact angles are maintained after oxygen plasma ashing alone or combined with a TMAH wet etch. This illustrates the chemical stability provided by the PFPE backbone of the Fluorolink-D epoxy, maintaining low surface energy properties of the coating through reactive processing steps typically used in semiconductor fabrication.

It is to be understood that the above description is intended to be illustrative and not restrictive. Many embodiments and applications other than the examples provided would be apparent to those skilled in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their broadest reasonable constructions and their ordinary meanings as understood by those skilled in the art unless an explicit indication to the contrary is made herein. In particular, use of the singular articles such as "a," "the," "said," etc. should be read to recite one or more of the indicated elements unless a claim recites an explicit limitation to the contrary.

What is claimed is:

1. A formulation for a hydrophobic photoresist coating to be applied to a surface of a printhead, the formulation comprising:
    an epoxidized perfluoropolyether having epoxy functional groups;
    a photoacid generator chosen from metallic onium salts and non-metallic onium salts;
    a fluorinated organic solvent present in a first amount and being capable of dissolving at least the epoxidized perfluoropolyether; and
    a fluorinated organic co-solvent present in a second amount and being capable of dissolving at least the photoacid generator, the second amount being less than the first amount;
    wherein the hydrophobic photoresist coating formulation is to retain its hydrophobicity during and after being formed into the hydrophobic photoresist coating by:
        applying the formulation onto an area of the printhead surface;
        exposing at least a portion of the area of the printhead surface to electromagnetic radiation;
        thermally crosslinking the epoxidized perfluoropolyether on the area of the printhead surface; and
        developing an unexposed portion of the area of the printhead surface with a fluorinated organic develop solvent.

2. The formulation of claim 1, wherein the epoxy functional groups on the epoxidized perfluoropolyether are capable of reacting with acid from the photoacid generator to initiat crosslinking of the epoxidized perfluoropolyether.

3. The formulation of claim 1, further comprising a compatibilizer, a sensitizer, or combinations thereof.

4. The formulation of claim 1, wherein the hydrophobic photoresist coating on the printhead surface exhibits a contact angle with water of greater than 90°.

5. The formulation of claim 1, wherein:
    the fluorinated organic solvent is chosen from 4-(trifluoromethoxy)toluene, 1,3,5-tris(trifluoromethyl)benzene, 2,5-bis(trifluoromethyl)bromobenzene, and 1,4-bis(trifluoromethyl)benzene; and
    the fluorinated organic co-solvent is chosen from trifluorotoluene (TFT), 3-methylbenzotrifluoride, 2-fluorobenzotrifluoride, 4-methylbenzotrifluoride, 2-chlorobenzotrifluoride, α,α,α-trifluoro-m-tolunitrile, and 2,2,3,4,4,4-hexafluoro-1-butanol.

6. The formulation of claim 1, wherein the photoacid generator is chosen from triarylsulfonium hexafluorophosphate and triarylsulfonium hexafluoroantimonate.

7. The formulation of claim 6, wherein the fluorinated organic solvent is 1,4-bis(trifluoromethyl)benzene, and the fluorinated organic co-solvent is trifluorotoluene (TFT).

8. The formulation of claim 7, wherein the hydrophobic photoresist coating on the printhead surface exhibits a contact angle with water of about 110°.

9. The formulation of claim 7, wherein a ratio of solvent to co-solvent ranges from about 60:40 to about 80:20.

10. The formulation of claim 6, wherein the fluorinated organic solvent is 1,4-bis(trifluoromethyl)benzene, the fluorinated organic co-solvent is 2,2,3,4,4,4-hexafluoro-1-butanol, and wherein a ratio of solvent to co-solvent is about 80:20.

11. The formulation of claim 1, wherein the printhead surface includes, beneath the hydrophobic photoresist coating, a coating formed from an epoxy negative tone photoresist material.

12. A method of coating an inkjet printhead surface with a hydrophobic photoresist material, the method comprising the steps of:
spin coating a hydrophobic photoresist material formulation onto an area of the printhead surface, the formulation including:
an epoxidized perfluoropolyether having epoxy functional groups;
a photoacid generator chosen from metallic onium salts and non-metallic onium salts;
a first amount of a fluorinated organic solvent capable of dissolving at least the epoxidized perfluoropolyether; and
a second amount of a fluorinated organic co-solvent capable of dissolving at least the photoacid generator, the second amount being less than the first amount;
exposing at least a portion of the area of the printhead surface to electromagnetic radiation;
thermally crosslinking the epoxidized perfluoropolyether on the area of the printhead surface; and
developing an unexposed portion of the area of the printhead surface with a fluorinated organic develop solvent to form a hydrophobic photoresist coating;
wherein the hydrophobic photoresist coating formed from the hydrophobic photoresist material is to retain its hydrophobicity.

13. The method of claim 12, wherein the hydrophobic photoresist coating on the inkjet printhead surface exhibits a contact angle with water greater than 90°.

14. The method of claim 12, wherein:
the fluorinated organic solvent is chosen from 4-(trifluoromethoxy)toluene, 1,3,5-tris(trifluoromethyl)benzene, 2,5-bis(trifluoromethyl)bromobenzene, and 1,4-bis(trifluoromethyl)benzene; and
the fluorinated organic co-solvent is chosen from trifluorotoluene (TFT), 3-methylbenzotrifluoride, 2-fluorobenzotrifluoride, 4-methylbenzotrifluoride, 2-chlorobenzotrifluoride, α,α,α-trifluoro-m-tolunitrile, and 2,2,3,4,4,4-hexafluoro-1-butanol.

15. The method of claim 12, wherein the photoacid generator is chosen from triarylsulfonium hexafluorophosphate and triarylsulfonium hexafluoroantimonate.

16. The method of claim 15, wherein the fluorinated organic solvent is 1,4-bis(trifluoromethyl)benzene, and the fluorinated organic co-solvent is trifluorotoluene (TFT).

17. The method of claim 16, wherein the hydrophobic photoresist coating on the printhead surface exhibits a contact angle with water of about 110°.

18. The method of claim 16, wherein a ratio of solvent to co-solvent ranges from about 60:40 to about 80:20.

19. The method of claim 16, wherein the fluorinated organic develop solvent comprises 1,4-bis(trifluoromethyl)benzene.

20. The method of claim 16, wherein the fluorinated organic solvent is 1,4-bis(trifluoromethyl)benzene, the fluorinated organic co-solvent is 2,2,3,4,4,4-hexafluoro-1-butanol, and wherein a ratio of solvent to co-solvent is about 80:20.

21. The method of claim 12, wherein the inkjet printhead surface includes, beneath the hydrophobic photoresist coating, a coating formed from an epoxy negative tone photoresist material.

* * * * *

UNITED STATES PATENT AND TRADEMARK OFFICE
CERTIFICATE OF CORRECTION

| | |
|---|---|
| PATENT NO. | : 8,512,935 B2 |
| APPLICATION NO. | : 13/318741 |
| DATED | : August 20, 2013 |
| INVENTOR(S) | : Garry Dale Hinch et al. |

It is certified that error appears in the above-identified patent and that said Letters Patent is hereby corrected as shown below:

In the Claims

In column 18, line 32, in Claim 2, delete "initiat" and insert -- initiate --, therefor.

Signed and Sealed this
Fifth Day of November, 2013

Teresa Stanek Rea
*Deputy Director of the United States Patent and Trademark Office*